United States Patent
Demirci et al.

(10) Patent No.: US 10,848,142 B2
(45) Date of Patent: Nov. 24, 2020

(54) CONSTANT RESISTANCE INPUT PASS SWITCH WITH OVERVOLTAGE PROTECTION

(71) Applicant: TEXAS INSTRUMENTS INCORPORATED, Dallas, TX (US)

(72) Inventors: Kemal Safak Demirci, Dallas, TX (US); Shanmuganand Chellamuthu, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 309 days.

(21) Appl. No.: 15/975,908

(22) Filed: May 10, 2018

(65) Prior Publication Data
US 2019/0348978 A1 Nov. 14, 2019

(51) Int. Cl.
*H03K 17/082* (2006.01)
*H03K 19/003* (2006.01)

(52) U.S. Cl.
CPC ... *H03K 17/0822* (2013.01); *H03K 19/00315* (2013.01)

(58) Field of Classification Search
CPC .......... H03K 17/0822; H03K 19/00315
See application file for complete search history.

(56) References Cited

U.S. PATENT DOCUMENTS

| | | | | |
|---|---|---|---|---|
| 5,966,030 A * | 10/1999 | Schmitt | ............ | H03K 19/00315 326/68 |
| 10,256,802 B1 * | 4/2019 | Vaz | .................. | H03K 17/08122 |
| 2004/0233604 A1 * | 11/2004 | Beck | .................. | H03K 17/0822 361/100 |
| 2006/0132173 A1 * | 6/2006 | Dover | .............. | H03K 19/00315 326/31 |
| 2014/0021979 A1 * | 1/2014 | Huang | ................ | H01L 27/0285 324/762.09 |
| 2017/0033556 A1 | 2/2017 | Tornila Oliver et al. | | |
| 2017/0063074 A1 * | 3/2017 | Yasusaka | ........... | H03K 17/0822 |
| 2017/0346274 A1 * | 11/2017 | Nakahara | ........... | H03K 17/0822 |

FOREIGN PATENT DOCUMENTS

| | | |
|---|---|---|
| DE | 19930036 | 1/2001 |
| KR | 20080046081 | 5/2008 |

OTHER PUBLICATIONS

International Search Report in corresponding PCT Application No. PCT/US2019/031413, dated Aug. 22, 2019 (2 pages).

\* cited by examiner

*Primary Examiner* — Adolf D Berhane
*Assistant Examiner* — Kevin H Sprenger
(74) *Attorney, Agent, or Firm* — John R. Pessetto; Charles A. Brill; Frank D. Cimino

(57) ABSTRACT

A protection device includes a dynamic gate bias circuit and an input pass switch. The dynamic gate bias circuit comprises an input pass switch configured to receive a first input and a first control signal; a voltage level shifter coupled to the input pass switch; a current mirror coupled to the voltage level shifter at a first node; a regulator coupled to the current mirror at a second node; and a transistor coupled to the first node, wherein the transistor is configured to receive a second control signal from the first node and to receive the first input.

14 Claims, 2 Drawing Sheets

CONSTANT RESISTANCE INPUT PASS SWITCH WITH OVERVOLTAGE PROTECTION

BACKGROUND

Multifunctional integrated circuits (ICs) often use multiple voltage levels inside the chip. Low voltage rated circuitry connected to an input pin should be isolated using protection devices from overvoltage or risk breakdowns and high leakage currents. Overvoltage may occur during fault conditions. For example, if the low voltage rated circuitry is shorted to the power pin of the IC, the low voltage rated circuitry is exposed to the voltage of the power source, which may be a much higher voltage than the voltage for which the low voltage rated circuitry was designed. In another example, if the low voltage rated circuitry is shorted to a nearby pin or signal pathway associated with high voltage rated circuitry provided on the same chip, the low voltage rated circuitry will be exposed to the higher voltage of the high voltage rated circuitry rather than its intended lower voltage. Protection devices are used to prevent excessively high voltages from damaging circuitry on a chip. However, protection devices may compromise performance of the circuitry. For example, some protection devices compromise the performance linearity of a circuit because of resistance variation, clipping of rail-to-rail input signals, or both.

SUMMARY

In some examples, a protection device includes an input pass switch configured to receive a first input and a first control signal, a voltage level shifter coupled to the input pass switch, a current mirror coupled to the voltage level shifter at a first node, a regulator coupled to the current mirror at a second node, and a transistor coupled to the first node. The transistor is configured to receive a second control signal from the first node and to receive the first input.

BRIEF DESCRIPTION OF THE DRAWINGS

For a detailed description of various examples, reference will now be made to the accompanying drawings in which.

DETAILED DESCRIPTION

Described herein is an example of a dynamic gate bias circuit used in combination with an input pass switch as a protection device to protect low voltage rated circuits from overvoltage without affecting the performance of the circuitry. The dynamic gate bias circuit in the disclosed examples allows the resistance across the input pass switch to be relatively constant over process, supply voltage, and temperature (PVT) corners. By maintaining the input pass switch's resistance relatively constant over PVT variations, the impact on the circuit's performance is reduced. The illustrative dynamic gate bias circuit includes a voltage level shifter, a current mirror, and a regulator including an error amplifier. The current mirror and the regulator are used to generate the control input to the input pass switch while the voltage level shifter level shifts the sensed input voltage. In some examples, the resistance of the input pass switch is dependent on the characteristics of the switch itself, the control input, and the input voltage. The control input varies in response to the input voltage, allowing the resistance of the input pass switch to stay relatively constant.

Figure 1:
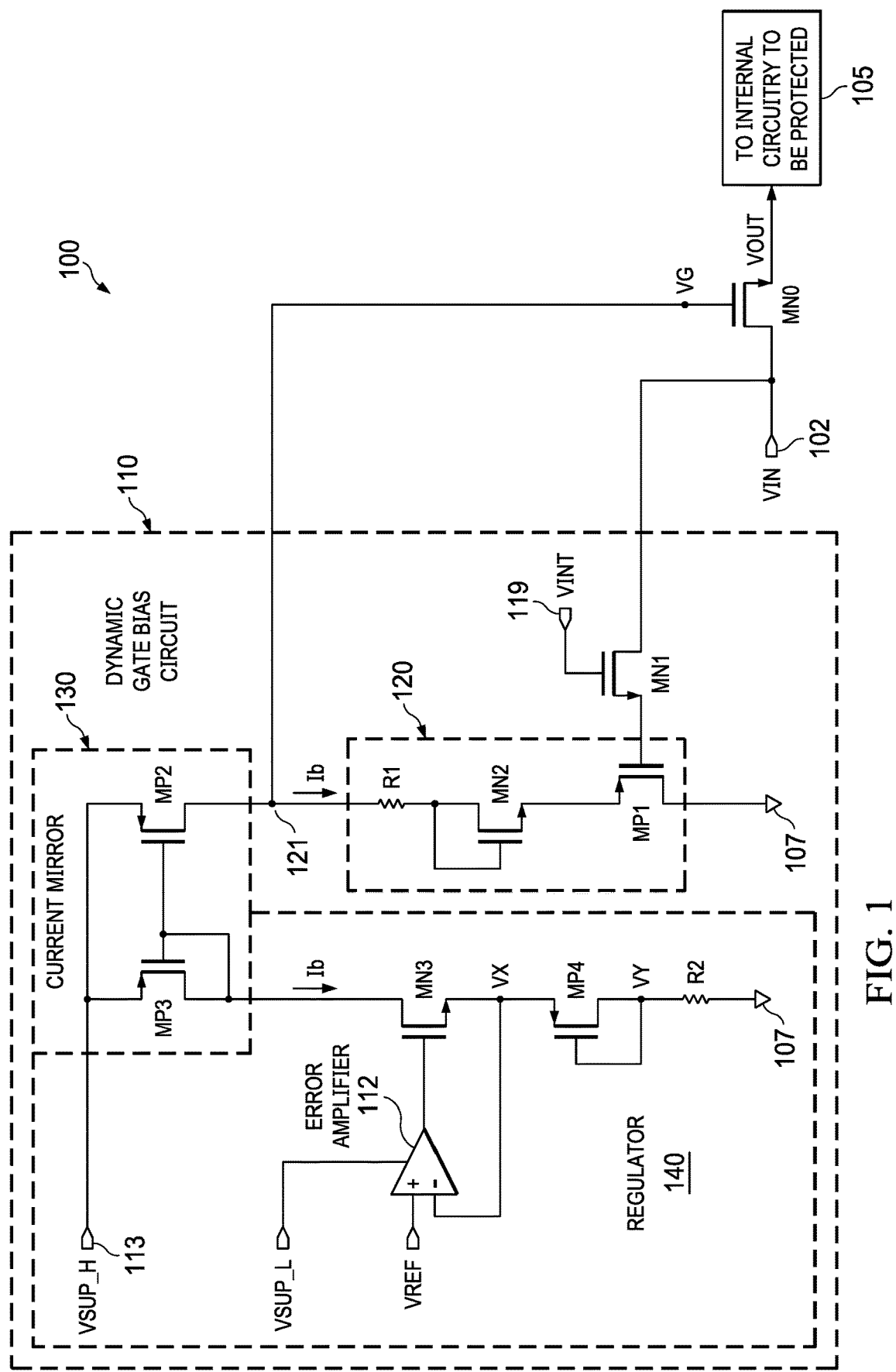
FIG. 1 illustrates an example circuit of a protection device according to one embodiment.

FIG. 1 illustrates an example circuit of a protection device 100, according to one embodiment. The protection device 100 in this example includes a dynamic gate bias circuit 110 coupled to an input pass switch MN0. The dynamic gate bias circuit 110 and input pass switch MN0 help to avoid an overvoltage condition from being presented to and damaging circuitry 105. The circuitry 105 and the dynamic gate bias circuit 110 and input pass switch MN0 are fabricated on the same semiconductor die in some examples. The circuitry 105 may be any low voltage circuitry that needs protection from an input overvoltage bias.

MN0 acts as an input pass switch between VIN and the circuitry 105. The transistor MN0 in this embodiment comprises an n-type metal oxide semiconductor field effect transistor (NMOS), but alternatively can be implemented as a p-type metal oxide semiconductor field effect transistor (PMOS). MN0 includes a control input and a pair of current terminals. As a field effect transistor, the control input includes a gate terminal and the current terminals comprise source and drain terminals. In yet other examples, the protection device can be implemented with bipolar junction transistors (BJTs) and, in those examples, the control input comprises a base terminal and the current terminals comprise emitter and collector terminals. In the example of FIG. 1 in which MN0 is an NMOS device, the drain of MN0 is coupled to an input node 102 to receive an input signal VIN and helps to ensure an overvoltage condition is not presented to the circuitry 105. The source of MN0 provides the output voltage VOUT to the circuitry 105.

The dynamic gate bias circuit 110 includes a level shifter 120, current mirror 130, regulator 140, and a transistor MN1. The level shifter 120 includes resistor R1 and transistors MN2 and MP1. The source of MN2 is connected to the source of MP1 and the drain of MP1 is connected to a ground node 107. The gate of MP1 is connected to the source of MN1. The gate of MN2 is connected MN2's drain and to resistor R1 as shown.

The current mirror 130 comprises transistors MP2 and MP3. The gates of MP2 and MP3 are connected together and to the drain of MP3. The drains of MP2 and MP3 are connected to a power supply voltage node 113 (VSUP_H). In some embodiments, power supply voltage node 113 (VSUP_H) supplies a positive voltage, such as +14 VDC. The regulator 140 comprises transistors MN3 and MP4, resistor R2 (which may be implemented with the same resistance as R1), and error amplifier 112. The drain of MP3 is connected to the drain of MN3 and the source of MN3 is connected to the source of MP4. The drain of MP4 is connected to resistor R2, which is connected to ground node 107. The node interconnecting MN3 to MP4 and designated as VX in FIG. 1 is also coupled to a negative input (−) of the error amplifier 112. A reference voltage VREF is provided to the positive (+) input of the error amplifier. The error amplifier 112 is powered by a supply voltage VSUP_L, which can be lower than VSUP_H. In some embodiments, supply voltage VSUP_L supplies a positive voltage, such as +5 VDC. The output of the error amplifier 112 is coupled to and drives the gate of MN3.

Transistors MN1, MN2, and MN3 in the example of FIG. 1 comprise NMOS devices but can be implemented as other types of transistors (e.g., PMOS devices, n-type or p-type BJTs, etc.). Further, transistors MP1, MP2, MP3, and MP4 comprise PMOS devices in the example of FIG. 1 but can be implemented as other types of transistors (e.g., NMOS devices, n-type or p-type BJTs, etc.) in other examples.

To bias MN0, protection device 100 uses the dynamic gate bias circuit 110. MN0 and MN1 are chosen such that the transistors withstand drain voltages higher than the voltage for which circuitry 105 is rated without entering the breakdown region or becoming damaged. The drain of MN1 is connected to input node 102 and receives the input signal VIN as the drain voltage. The gate of MN1 is connected to a reference voltage node 119 (VINT). VINT is chosen such that MN1 acts as an open switch and blocks voltage levels higher than the gate breakdown voltage of MP1 and MN1. For example, VINT is chosen such that the difference between VINT and voltage levels higher than the gate breakdown voltages of MP1 and MN1, VIN≥VBREAKDOWN(MP1, MN1), is less than the threshold voltage of MN1, VINT−VIN<VT(MN1). The input signal VIN is then provided to the gate of MP1 through MN1 and level shifted up by level shifter 120, which as noted above, includes MP1, MN2, and R1. The bias current Ib through MN2 and MP1 is generated using regulator 140 and current mirror 130. Within regulator 140, the error amplifier 112 forces VX to equal VREF (i.e., VX=VREF). Thus, bias current Ib is the difference between VREF and the source-to-gate voltage of MP4 divided by the resistance or R2

$$\left(Ib = \frac{VREF - VSG(MP4)}{R2}\right).$$

The current Ib is copied using current mirror 130, which includes MP2 and MP3 and, in some examples, has a mirror ratio of one. The mirror ratio of one may be achieved by choosing MP2 and MP3 such that the two transistors have the same or very similar properties (e.g., channel lengths, widths, threshold voltages, and the like). The mirror ratio may be other than one, for example, where more transistors are placed in parallel on the output side of current mirror 130 with MP2 than on the input side of current mirror 130 with MP3. Node 121 interconnecting the drain of MP2 to resistor R1 provides the gate voltage (VG) for the input pass switch MN0. VG is the input voltage VIN plus the source-to-gate voltage of MP1 plus the source-to-gate voltage of MP2 plus VREF minus the source-to-gate voltage of MP4 (i.e., VG=VIN+VSG(MP1)+VGS(MN2)+VREF−VSG(MP4)).

In some embodiments, MP4 and MP1 may be matched such that the two transistors have similar channel lengths, widths, threshold voltages, and the like so that the source-to-gate voltage drops of MP1 and MP4 cancel out. In that case, VG is represented by VG=VIN+VGS(MN2)+VREF. The source voltage of MN0 is VIN so VGS(MN0)=VG−VIN=VIN+VGS(MN2)+VREF−VIN=VGS(MN2)+VREF. The on-resistance of MN0, R(MN0), is thus represented as $$R(MN0) = \frac{L}{W\mu_n C_{ox}(VGS(MN2) + VREF - VT(MN0))}.$$

Note $$\frac{L}{W}$$

represents the geometric channel length and width of MN0, $\mu_n$ represents the electron mobility in the channel of MN0, and $C_{ox}$ represents the oxide capacitance per unit area of MN0. Because MN2 is matched to MN1 and MN0, the source-to-gate voltage drop of MN2 is approximately equal to the threshold voltages of MN2, MN0, and MN1: VGS(MN2)≈VT(MN2)=VT(MN0)=VT(MN1). As such, $$R(MN0) = \frac{L}{W\mu_n C_{ox}(VREF)},$$

which is nearly constant over PVT corners since VREF is a constant voltage

Where the input signal VIN is less than the gate breakdown voltages of MN1 and MP1 and less than the chosen value of VINT minus the threshold voltage of MN1, VIN<VINT−VT(MN1), VG will mimic VIN, increasing where VIN increases and decreasing where VIN decreases. Since the source-to-gate voltage of MN0 is VG minus VIN and greater than the threshold voltage of MN0, VGS(MN0)=VG−VIN>VT(MN0), input pass switch MN0 acts as a closed switch with low resistance, allowing the input signal VIN to pass through MN0 without clipping. For higher levels of VIN where VIN is greater than the chosen value of VINT minus the threshold voltage of MN1, VIN>VINT−VT(MN1), input pass switch MN1 limits the voltage at the gate of MP1 to VINT minus the threshold voltage of MN1, VINT−VT(MN1). Therefore, VG becomes VINT minus the threshold voltage of MN1 plus the source-to-gate voltage of MN2 plus VREF, or VG=VINT−VT(MN1)+VGS(MN2)+VREF. Since the resistance of input pass switch MN0 is inversely proportional to the source-to-gate voltage of MN0 minus the threshold voltage of MN0, VGS−VT(MN0), and the source voltage of MN0 is approximately equal to VIN, the resistance of input pass switch MN0 R(MN0) is represented by $$R(MN0) = \frac{L}{W\mu_n C_{ox}(VINT - VT(MN1) + VGS(MN2) + VREF - VIN - VT(MN0))}.$$

As noted above, $$\frac{L}{W}$$

represents the geometric channel length and width of MN0, $\mu_n$ represents the electron mobility in the channel of MN0, and $C_{ox}$ represents the oxide capacitance per unit area of MN0. Because MN2 is matched to MN1 and MN0, the source-to-gate voltage drop of MN2 is approximately equal to the threshold voltages of MN2, MN0, and MN1: VGS(MN2)≈VT(MN2)=VT(MN0)=VT(MN1). This simplifies the representation of the resistance of MN0 to $$R(MN0) = \frac{L}{W\mu_n C_{ox}(VINT + VREF - VIN - VT(MN0))}.$$

In some embodiments, VINT is chosen to be the maximum anticipated peak value of VIN, VINT=max(VIN), and the reference voltage VREF is chosen to be greater than the threshold voltage of MN0 such that the source-to-gate voltage of MN0 is greater than the threshold voltage of MN0, VGS(MN0)>VT(MN0). Thus, input pass switch MN0 acts as a closed switch with relatively low resistance and passes the input signal without clipping. Note that even where higher input voltage levels are applied, there is no source-to-gate voltage VGS over voltage of MN0 because VG is dynamically biased with respect to VIN. For input voltage levels less than VG minus the threshold voltage of MN0, VIN<VG−VT(MN0), the gate voltage VG is the input voltage VIN plus the source-to-gate voltage of MN2 plus the reference voltage VREF, VG(MN0)=VIN+VGS(MN2)+VREF. There is no gate overvoltage bias because VG is dynamically biased with respect to VIN. For input voltage levels greater than VG minus the threshold voltage of MN0, VIN>VG−VT, and power supply voltage node 113 VSUP_H chosen to be greater than VINT plus the reference voltage VREF, VSUP_H>VINT+VREF, the highest possible gate voltage is VINT minus the threshold voltage of MN1 plus the source-to-gate voltage of MN2 plus the reference voltage VREF, VG(MN0)=VINT−VT(MN1)+VGS(MN2)+VREF. As discussed above, MN2 is matched to MN1 and MN0 such that the source-to-gate voltage drop of MN2 is approximately equal to the threshold voltages of MN2, MN0, and MN1: VGS(MN2)≈VT(MN2)=VT(MN0)=VT(MN1). This simplifies the representation of VG(MN0) to VG(MN0)≅VINT+VREF. In some embodiments, VINT and VREF are chosen such that VINT plus VREF, VINT+VREF, is smaller than the VGS breakdown of MN0 so there is no gate overvoltage bias. Under these conditions, circuitry 105 is protected from overvoltage bias.

Figure 2:
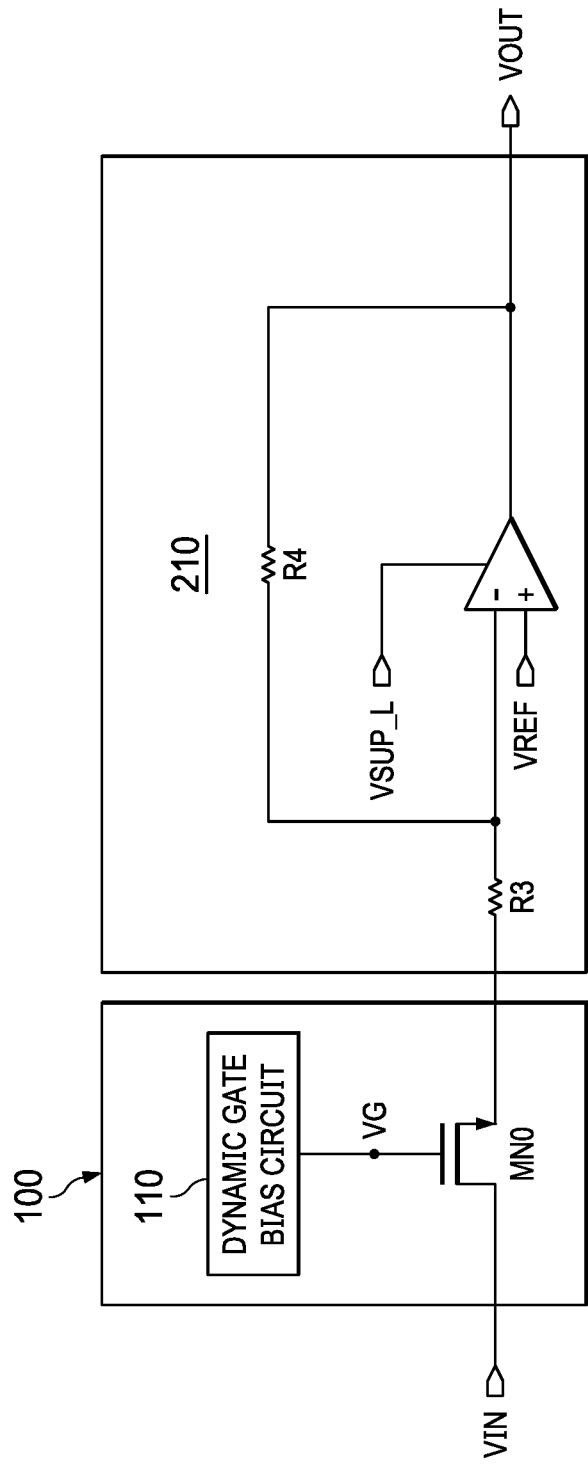
FIG. 2 illustrates an example circuit of a protection device according to one embodiment.

FIG. 2 provides an illustrative use of the example protection device 100 of FIG. 1. The dynamic gate bias circuit and input pass switch MN0 are coupled to an amplifier 210. The amplifier 210 in the example of FIG. 2 is configured as an inverting amplifier whose gain is generally given as $$A_v = -\frac{R4}{R3}.$$

The gain of amplifier 210, however, is also dependent on the resistance of the input pass switch MN0. Including the effect of the resistance of input pass switch MN0, the gain of the amplifier 210 becomes $$A_v = -\frac{R4}{R3 + R(MN0)}.$$

Because dynamic gate bias circuit 110 reduces the variation in the resistance of MN0 over the rail-to-rail input signal as discussed above with reference to FIG. 1, the variation in gain of amplifier 210 is reduced while amplifier 210 remains protected from overvoltage.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A protection device 100, comprising:
a first transistor configured to receive a first input;
a voltage level shifter coupled to a terminal of the first transistor, wherein the voltage level shifter comprises a second transistor, a third transistor coupled to the second transistor, and a first resistor coupled to the third transistor;
a current mirror coupled to the first resistor at a first node, wherein the current mirror comprises a fourth transistor and a fifth transistor coupled to the fourth transistor, wherein the fourth transistor and fifth transistor are configured to receive a first control signal;
a regulator coupled to the fifth transistor at a second node, wherein the regulator comprises a sixth transistor coupled to a seventh transistor, a second resistor coupled to the seventh transistor, wherein the sixth transistor is configured to receive a second control signal; and
an eighth transistor coupled to the first node.

2. The protection device of claim 1, wherein the first, third, sixth, and eighth transistors are n-type metal oxide semiconductor field effect transistors and the second, fourth, fifth, and seventh transistors are p-type metal oxide semiconductor field effect transistors.

3. The protection device of claim 1, wherein the first and eighth transistors withstand drain voltages greater than a predetermined threshold without entering a breakdown region.

4. The protection device of claim 1, wherein the first transistor is configured to be turned off responsive to voltages greater than the gate breakdown voltages of the second and third transistors are applied.

5. The protection device of claim 1, wherein the current mirror has a mirror ratio of 1.

6. The protection device of claim 1, wherein the second and seventh transistors are matched and the first, third, and eighth transistors are matched.

7. The protection device of claim 1, wherein the regulator determines a current value for the first node at the second node and the current mirror reflects the current value from the second node to the first node.

8. A protection device, comprising:
a first transistor configured to receive a first input and a first control signal and comprising an n-type metal oxide semiconductor field effect transistor (NFET), wherein the first control signal is chosen such that the first transistor is shut off in response to the first input comprising a voltage greater than a predetermined threshold;
a voltage level shifter coupled to a terminal of the first transistor, wherein the voltage level shifter comprises a second transistor, a third transistor coupled to the second transistor, and a first resistor coupled to the third transistor and wherein the second transistor comprises p-type metal oxide semiconductor field effect transistor (PFET) and the third transistor comprises an NFET;

a current mirror coupled to the first resistor at a first node, wherein the current mirror comprises a fourth transistor and a fifth transistor coupled to the fourth transistor, wherein the fourth transistor and fifth transistor are configured to receive a first control signal and comprise PFETs;

a regulator coupled to the fifth transistor at a second node, wherein the regulator comprises a sixth transistor coupled to a seventh transistor, a second resistor coupled to the seventh transistor, wherein the sixth transistor is configured to receive a second control signal and comprises an NFET and the seventh transistor comprises a PFET; and an eighth transistor coupled to the first node and configured to receive the second control signal from the first node and to receive the first input, wherein the eighth transistor comprises an NFET.

9. The protection device of claim 8, wherein the first and eighth transistors withstand drain voltages greater than a predetermined threshold without entering a breakdown region.

10. The protection device of claim 8, wherein the first transistor is configured to be turned off responsive to voltages greater than the gate breakdown voltages of the second and third transistors are applied.

11. The protection device of claim 8, wherein the current mirror has a mirror ratio of 1.

12. The protection device of claim 8, wherein the second and seventh transistors are matched and the first, third, and eighth transistors are matched.

13. The protection device of claim 8, wherein the predetermined threshold is chosen based on a breakdown voltage of one or more components of the voltage level shifter.

14. The protection device of claim 8, wherein the regulator determines the second control signal for the first node at the second node and the current mirror reflects the second control signal from the second node to the first node.

* * * * *